United States Patent
He et al.

(10) Patent No.: US 9,596,537 B2
(45) Date of Patent: Mar. 14, 2017

(54) SYSTEMS AND METHODS FOR REDUCTION OF AUDIO ARTIFACTS IN AN AUDIO SYSTEM WITH DYNAMIC RANGE ENHANCEMENT

(71) Applicant: Cirrus Logic, Inc., Austin, TX (US)

(72) Inventors: Ku He, Austin, TX (US); Tejasvi Das, Austin, TX (US); John L. Melanson, Austin, TX (US); Aniruddha Satoskar, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 40 days.

(21) Appl. No.: 14/483,659

(22) Filed: Sep. 11, 2014

(65) Prior Publication Data
US 2016/0080862 A1    Mar. 17, 2016

(51) Int. Cl.
*H03G 3/00*     (2006.01)
*H04R 3/00*     (2006.01)
(Continued)

(52) U.S. Cl.
CPC ........... *H04R 3/00* (2013.01); *H03G 3/00* (2013.01); *H03G 3/20* (2013.01); *H03G 3/3005* (2013.01);
(Continued)

(58) Field of Classification Search
CPC .......... H04R 3/00; H03G 3/20; H03G 3/3036; H03G 3/3052; H03M 1/70; H03M 1/662; H03M 1/0863; H03M 1/186
(Continued)

(56) References Cited

U.S. PATENT DOCUMENTS 1,446,440 A    5/1984   Bell
4,972,436 A   11/1990   Halim et al.
(Continued)

FOREIGN PATENT DOCUMENTS

EP    0966105 A2    12/1999
EP    1575164 A2    9/2005
(Continued)

OTHER PUBLICATIONS

Thaden, Rainer et al., a Loudspeaker Management System with FIR/IRR Filtering; AES 32nd International Conference, Hillerod, Denmark, Sep. 21-23, 2007; pp. 1-12.
(Continued)

*Primary Examiner* — Vivian Chin
*Assistant Examiner* — Ammar Hamid
(74) *Attorney, Agent, or Firm* — Jackson Walker L.L.P.

(57) ABSTRACT

In accordance with embodiments of the present disclosure, a control circuit may be configured to, responsive to an indication to switch between gain modes of a signal path having an analog path portion and a digital signal path portion, switch a selectable analog gain of the analog path portion between a first analog gain and a second analog gain, switch a selectable digital gain of the digital signal path portion between a first digital gain and a second digital gain, wherein the product of the first analog gain and the first digital gain is approximately equal to the product of the second analog gain and the second digital gain, and control an analog response of the signal path to reduce the occurrence of audio artifacts present in the output signal as a result of the switch between gain modes of the signal path.

A signal path may have an analog path portion and a digital signal path portion. The digital portion may have a selectable digitally-controlled gain and may be configured to convert a digital audio input signal into an analog input (Continued)

signal in conformity with the selectable digitally-controlled gain, the digital signal path portion comprising a modulator including a forward path and a feedback path. The forward path may include a loop filter for generating a filtered signal responsive to the digital audio input signal and a feedback signal, a quantizer responsive to the filtered signal for generating a quantized signal, and a first gain element configured to apply the selectable digitally-controlled gain to a signal within the forward path. The feedback path may be configured to generate the feedback signal responsive to the quantized signal, the feedback path including a second gain element having a gain inversely proportional to the selectable digitally-controlled gain.

36 Claims, 7 Drawing Sheets

(51) Int. Cl.
  H03G 3/20 (2006.01)
  H04R 3/04 (2006.01)
  H03G 3/30 (2006.01)
  H03F 99/00 (2009.01)
(52) U.S. Cl.
  CPC ............ *H03G 3/3089* (2013.01); *H04R 3/04* (2013.01); *H04R 2430/00* (2013.01)
(58) Field of Classification Search
  USPC ..... 381/107, 120, 102–106, 56–58; 341/139, 341/144
  See application file for complete search history.

(56) References Cited

U.S. PATENT DOCUMENTS

| | | | |
|---|---|---|---|
| 4,999,628 A | 3/1991 | Kakubo et al. |
| 4,999,830 A | 3/1991 | Agazzi |
| 5,148,167 A | 9/1992 | Ribner |
| 5,321,758 A | 6/1994 | Charpentier et al. |
| 5,323,159 A | 6/1994 | Imamura et al. |
| 5,550,923 A | 8/1996 | Hotvet |
| 5,600,317 A | 2/1997 | Knoth et al. |
| 5,714,956 A | 2/1998 | Jahne et al. |
| 5,808,575 A | 9/1998 | Himeno et al. |
| 5,810,477 A | 9/1998 | Abraham et al. |
| 6,088,461 A | 7/2000 | Lin |
| 6,201,490 B1 | 3/2001 | Kawano et al. |
| 6,271,780 B1 | 8/2001 | Gong et al. |
| 6,353,404 B1 | 3/2002 | Kuroiwa |
| 6,745,355 B1 | 6/2004 | Tamura |
| 6,768,443 B2 | 7/2004 | Willis |
| 6,853,242 B2 | 2/2005 | Melanson et al. |
| 6,888,888 B1 | 5/2005 | Tu et al. |
| 7,020,892 B2 | 3/2006 | Levesque et al. |
| 7,023,268 B1 | 4/2006 | Taylor et al. |
| 7,061,312 B2 | 6/2006 | Andersen et al. |
| 7,167,112 B2 | 1/2007 | Andersen et al. |
| 7,216,249 B2 | 5/2007 | Fujiwara et al. |
| 7,403,010 B1 | 7/2008 | Hertz |
| 7,440,891 B1 | 10/2008 | Shozakai et al. |
| 7,522,677 B2 | 4/2009 | Liang |
| 7,583,215 B2 | 9/2009 | Yamamoto et al. |
| 8,060,663 B2 | 11/2011 | Murray et al. |
| 8,289,425 B2 | 10/2012 | Kanbe |
| 8,330,631 B2 | 12/2012 | Kumar et al. |
| 8,362,936 B2 | 1/2013 | Ledzius et al. |
| 8,717,211 B2 | 5/2014 | Miao et al. |
| 8,873,182 B2 | 10/2014 | Liao et al. |
| 9,071,267 B1 | 6/2015 | Schneider et al. |
| 9,071,268 B1 | 6/2015 | Schneider et al. |
| 9,148,164 B1 | 9/2015 | Schneider et al. |
| 9,306,588 B2 | 4/2016 | Das et al. |
| 9,337,795 B2 | 5/2016 | Das et al. |
| 9,391,576 B1 | 7/2016 | Satoskar et al. |
| 2001/0009565 A1 | 7/2001 | Singvall |
| 2004/0184621 A1 | 9/2004 | Andersen et al. |
| 2005/0258989 A1 | 11/2005 | Li et al. |
| 2005/0276359 A1 | 12/2005 | Xiong |
| 2006/0056491 A1 | 3/2006 | Lim et al. |
| 2006/0098827 A1 | 5/2006 | Paddock et al. |
| 2006/0284675 A1 | 12/2006 | Krochmal et al. |
| 2007/0057720 A1 | 3/2007 | Hand et al. |
| 2007/0092089 A1 | 4/2007 | Seefeldt et al. |
| 2007/0103355 A1 | 5/2007 | Yamada |
| 2007/0120721 A1 | 5/2007 | Caduff et al. |
| 2007/0123184 A1 | 5/2007 | Nesimoglu et al. |
| 2008/0030577 A1 | 2/2008 | Cleary et al. |
| 2008/0159444 A1 | 7/2008 | Terada |
| 2009/0021643 A1 | 1/2009 | Hsueh et al. |
| 2009/0058531 A1 | 3/2009 | Hwang et al. |
| 2009/0084586 A1 | 4/2009 | Nielsen |
| 2009/0220110 A1 | 9/2009 | Bazarjani et al. |
| 2010/0183163 A1 | 7/2010 | Matsui et al. |
| 2011/0013733 A1 | 1/2011 | Martens et al. |
| 2011/0025540 A1 | 2/2011 | Katsis et al. |
| 2011/0063148 A1 | 3/2011 | Kolze et al. |
| 2011/0096370 A1 | 4/2011 | Okamoto |
| 2011/0136455 A1 | 6/2011 | Sundstrom et al. |
| 2011/0150240 A1 | 6/2011 | Akiyama et al. |
| 2011/0170709 A1 | 7/2011 | Guthrie et al. |
| 2011/0242614 A1 | 10/2011 | Okada |
| 2012/0001786 A1 | 1/2012 | Hisch |
| 2012/0047535 A1 | 2/2012 | Bennett et al. |
| 2012/0133411 A1* | 5/2012 | Miao ................. H03G 3/001 327/306 |
| 2012/0177201 A1 | 7/2012 | Ayling et al. |
| 2012/0177226 A1 | 7/2012 | Silverstein et al. |
| 2012/0188111 A1* | 7/2012 | Ledzius ................. H03M 1/70 341/144 |
| 2012/0207315 A1 | 8/2012 | Kimura et al. |
| 2012/0242521 A1 | 9/2012 | Kinyua |
| 2012/0250893 A1 | 10/2012 | Carroll et al. |
| 2012/0263090 A1 | 10/2012 | Porat et al. |
| 2012/0280726 A1 | 11/2012 | Colombo et al. |
| 2013/0106635 A1 | 5/2013 | Doi |
| 2013/0188808 A1 | 7/2013 | Pereira et al. |
| 2014/0105256 A1 | 4/2014 | Hanevich et al. |
| 2014/0105273 A1 | 4/2014 | Chen et al. |
| 2014/0135077 A1 | 5/2014 | Leviant et al. |
| 2014/0184332 A1 | 7/2014 | Shi et al. |
| 2014/0269118 A1 | 9/2014 | Taylor et al. |
| 2015/0214974 A1 | 7/2015 | Currivan |
| 2015/0214975 A1 | 7/2015 | Gomez et al. |
| 2015/0295584 A1 | 10/2015 | Das et al. |
| 2015/0381130 A1 | 12/2015 | Das et al. |
| 2016/0072465 A1 | 3/2016 | Das et al. |
| 2016/0080862 A1 | 3/2016 | He et al. |
| 2016/0080865 A1 | 3/2016 | He et al. |
| 2016/0173112 A1 | 6/2016 | Das et al. |

FOREIGN PATENT DOCUMENTS

| | | |
|---|---|---|
| EP | 1753130 A1 | 2/2007 |
| EP | 1798852 A2 | 6/2009 |
| EP | 2207264 A1 | 7/2010 |
| GB | 1599401 A | 9/1981 |
| GB | 2119189 A | 11/1983 |
| GB | 2307121 A | 6/1997 |
| GB | 2507096 A | 4/2014 |
| GB | 2527637 A | 12/2015 |
| JP | 20080294803 A | 12/2008 |
| WO | WO0054403 A1 | 9/2000 |
| WO | WO0237686 A2 | 5/2002 |
| WO | 2008067260 A1 | 6/2008 |
| WO | 2014113471 A1 | 7/2014 |
| WO | 2015160655 A1 | 10/2015 |
| WO | 2016040165 A1 | 3/2016 |

(56) References Cited

FOREIGN PATENT DOCUMENTS

| | | |
|---|---|---|
| WO | 2016040171 A1 | 3/2016 |
| WO | 2016040177 A1 | 3/2016 |

OTHER PUBLICATIONS

Thaden, Rainer et al., a Loudspeaker Management System with FIR/IRR Filtering; Slides from a presentation given at the 32nd AES conference "DSP for Loudspeakers" in Hillerod, Denmark in Sep. 2007; http://www.four-audio.com/data/AES32/AES32FourAudio.pdf; 23 pages.
GB Patent Application No. 1419651.3, Improved Analogue-to-Digital Convertor, filed Nov. 4, 2014, 65 pages.
Combined Search and Examination Report, GB Application No. GB1506258.1, Oct. 21, 2015, 6 pages.
International Search Report and Written Opinion, International Patent Application No. PCT/US2015/025329, mailed Aug. 11, 2015, 9 pages.
International Search Report and Written Opinion, International Patent Application No. PCT/US2015/048633, mailed Dec. 10, 2015, 11 pages.
International Search Report and Written Opinion, International Patent Application No. PCT/US2015/048591, mailed Dec. 10, 2015, 11 pages.
Combined Search and Examination Report, GB Application No. GB1510578.6, Aug. 3, 2015, 3 pages.
International Search Report and Written Opinion, International Application No. PCT/US2015/056357, mailed Jan. 29, 2015, 13 pages.
International Search Report and Written Opinion, International Application No. PCT/US2015/048609, mailed Mar. 23, 2016, 23 pages.
Combined Search and Examination Report, GB Application No. GB1514512.1, Feb. 11, 2016, 7 pages.
International Search Report and Written Opinion, International Application No. PCT/US2016/022578, mailed Jun. 22, 2016, 12 pages.
Combined Search and Examination Report, GB Application No. GB1602288.1, Aug. 9, 2016, 6 pages.
Combined Search and Examination Report, GB Application No. GB1603628.7, Aug. 24, 2016, 6 pages.
International Search Report and Written Opinion, International Application No. PCT/EP2016/062862, mailed Aug. 26, 2016, 14 pages.

\* cited by examiner

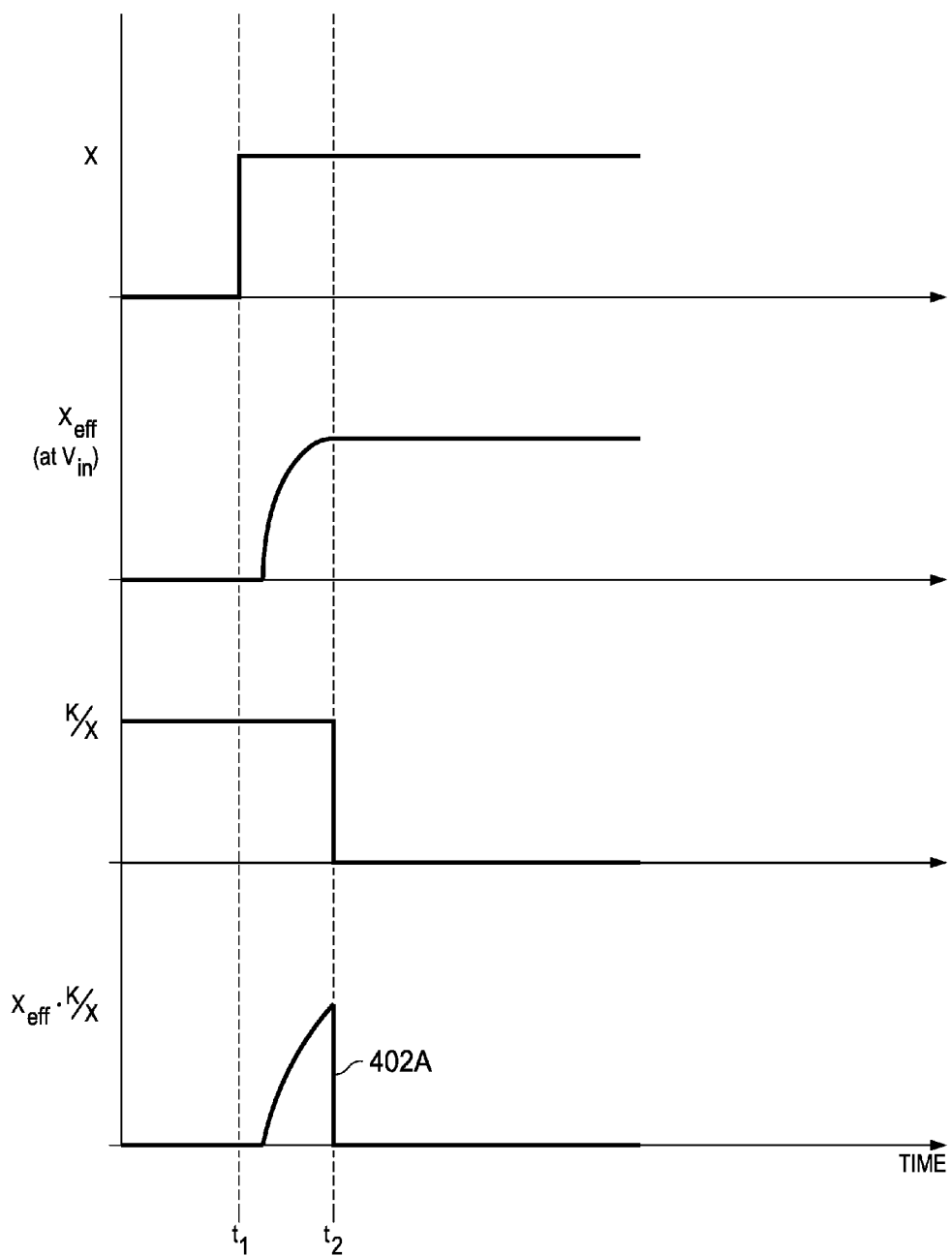

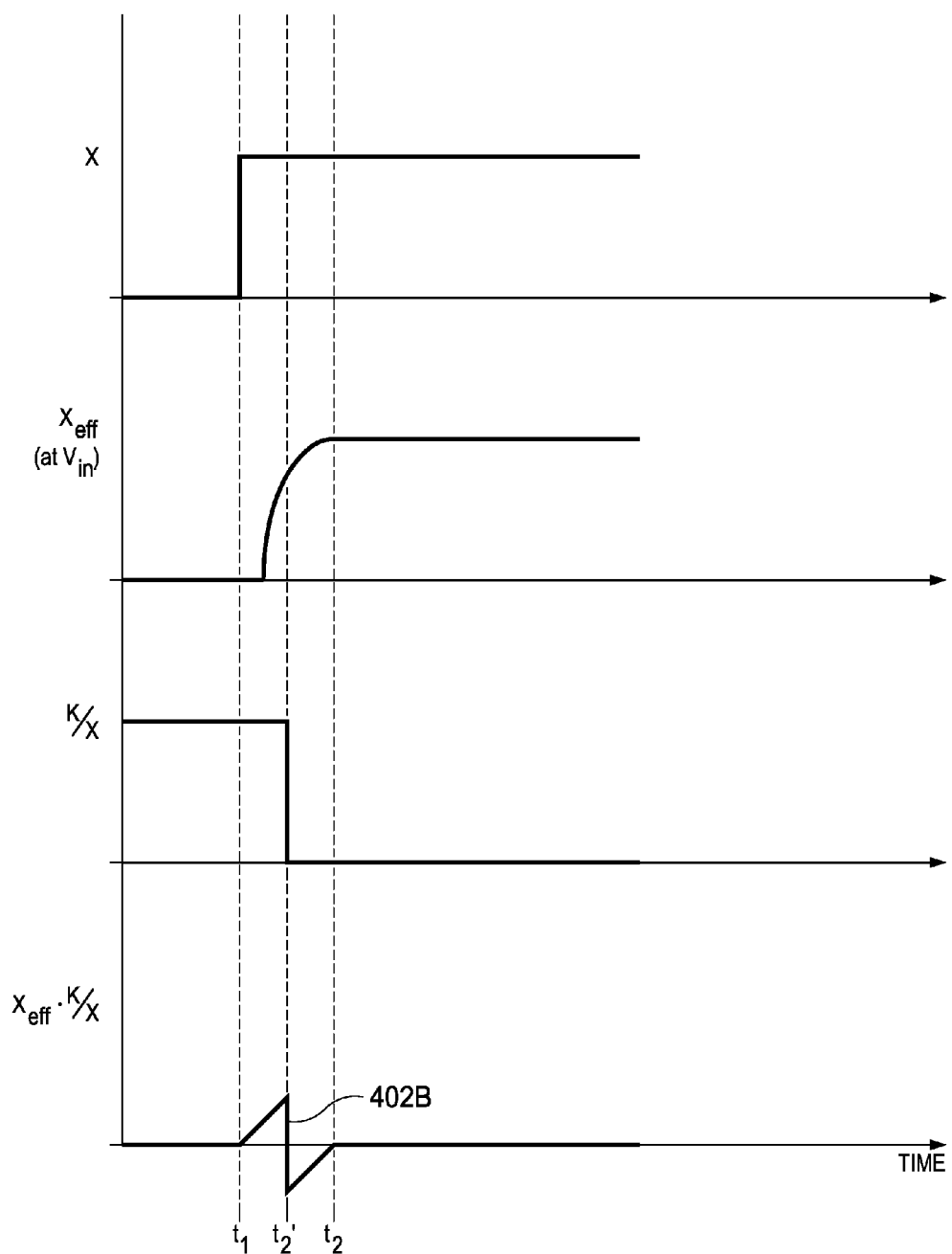

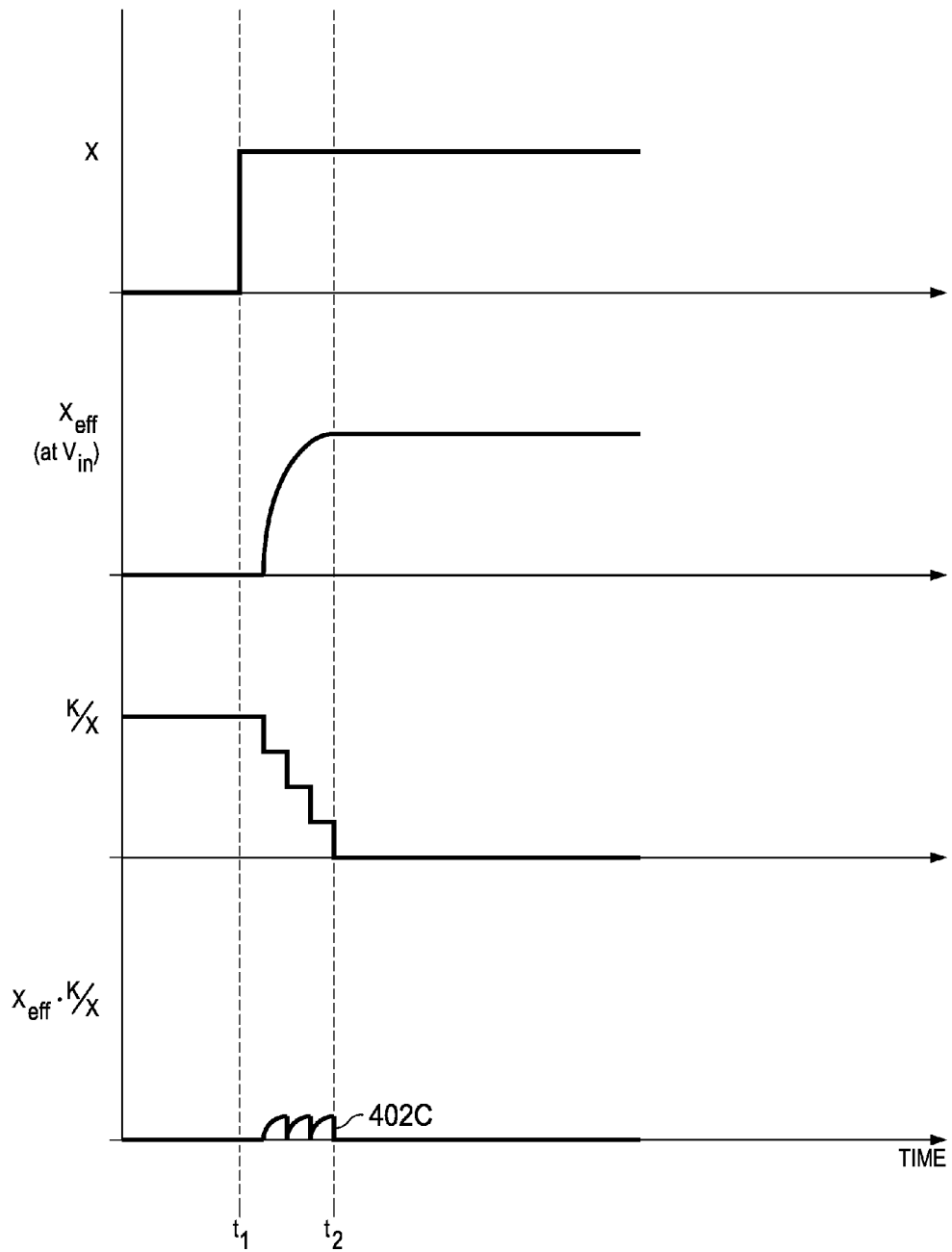

SYSTEMS AND METHODS FOR REDUCTION OF AUDIO ARTIFACTS IN AN AUDIO SYSTEM WITH DYNAMIC RANGE ENHANCEMENT

FIELD OF DISCLOSURE

The present disclosure relates in general to circuits for audio devices, including without limitation personal audio devices such as wireless telephones and media players, and more specifically, to systems and methods for enhancing a dynamic range of an audio signal path in an audio device while reducing the existence of audio artifacts when switching between dynamic range enhancement modes.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers.

One particular characteristic of a personal audio device which may affect its marketability and desirability is the dynamic range of its audio output signal. Stated simply, the dynamic range is the ratio between the largest and smallest values of the audio output signal. One way to increase dynamic range is to apply a high gain to the power amplifier. However, noise present in an audio output signal may be a generally monotonically increasing function of the gain of amplifier A1, such that any increased dynamic range as a result of a high-gain amplifier may be offset by signal noise which may effectively mask lower-intensity audio signals.

U.S. patent application Ser. No. 14/083,972, filed Nov. 19, 2013, entitled "Enhancement of Dynamic Range of Audio Signal Path," and assigned to the applicant (Cirrus Logic, Inc.) of the present disclosure (the "'972 Application") discloses methods and systems for enhancing the dynamic range of an audio signal path. In the '972 Application, an apparatus for providing an output signal to an audio transducer includes an analog signal path portion, a digital-to-analog converter (DAC), and a control circuit. The analog signal path portion has an audio input for receiving an analog signal, an audio output for providing the output signal, and a selectable analog gain, and may be configured to generate the output signal based on the analog signal and in conformity with the selectable analog gain. The DAC has a selectable digital gain and may be configured to convert a digital audio input signal into the analog signal in conformity with the selectable digital gain. The control circuit may be configured to select the selectable analog gain and select the selectable digital gain in accordance with one or more gain modes based on a magnitude of a signal indicative of the output signal, and may select the selectable analog gain and select the selectable digital gain so as to maintain a constant gain through the overall signal path regardless of the applicable gain mode.

In the dynamic range enhancement architecture of the '972 Application and similar architectures, the DAC may a have a latency or group delay and/or may also apply a transient response to the selectable digital gain, such that the selectable digital gain is effectively applied to an analog input signal as a transient switching between the two levels of the selectable digital gain. Without correction of such latency and transient, a glitch may be present in the output signal, which may cause audio artifacts perceptible to a listener.

SUMMARY

In accordance with the teachings of the present disclosure, one or more disadvantages and problems associated with existing approaches to maintaining a high dynamic range of an audio signal path may be reduced or eliminated.

In accordance with embodiments of the present disclosure, an apparatus for providing an output signal to an audio transducer may include a signal path and a control circuit. The signal path may include an analog signal path portion and a digital signal path portion. The analog signal path portion may have an audio input for receiving an analog input signal, an audio output for providing the output signal, and a selectable analog gain, and may be configured to generate the output signal based on the analog input signal and in conformity with the selectable analog gain. The digital signal path portion may have a selectable digital gain and may be configured to convert a digital audio input signal into the analog input signal in conformity with the selectable digital gain. The control circuit may be configured to, responsive to an indication to switch between gain modes of the signal path, switch the selectable analog gain between a first analog gain and a second analog gain, switch the selectable digital gain between a first digital gain and a second digital gain, wherein the product of the first analog gain and the first digital gain is approximately equal to the product of the second analog gain and the second digital gain, and control an analog response of the signal path to reduce the occurrence of audio artifacts present in the output signal as a result of the switch between gain modes of the signal path.

In accordance with these and other embodiments of the present disclosure, a method may be provided for use in a signal path comprising an analog signal path portion having an audio input for receiving an analog input signal, an audio output for providing the output signal, and a selectable analog gain, and configured to generate the output signal based on the analog input signal and in conformity with the selectable analog gain and further comprising a digital signal path portion having a selectable digital gain and configured to convert a digital audio input signal into the analog input signal in conformity with the selectable digital gain. The method may include, responsive to an indication to switch between gain modes of the signal path, switching the selectable analog gain between a first analog gain and a second analog gain, switching the selectable digital gain between a first digital gain and a second digital gain, wherein the product of the first analog gain and the first digital gain is approximately equal to the product of the second analog gain and the second digital gain, and controlling an analog response of the signal path to reduce the occurrence of audio artifacts present in the output signal as a result of the switch between gain modes of the signal path.

In accordance with these and other embodiments of the present disclosure, a personal audio device may include an audio transducer, a signal path, and a control circuit. The audio transducer may be configured to generate sound in accordance with an output signal received by the audio transducer. The signal path may be coupled to the audio transducer, and may include an analog signal path portion and a digital signal path portion. The analog signal path portion may have an audio input for receiving an analog input signal, an audio output for providing the output signal, and a selectable analog gain, and may be configured to generate the output signal based on the analog input signal and in conformity with the selectable analog gain. The digital signal path portion may have a selectable digital gain and may be configured to convert a digital audio input signal into the analog input signal in conformity with the selectable digital gain. The control circuit may be configured to, responsive to an indication to switch between gain modes of the signal path, switch the selectable analog gain between a first analog gain and a second analog gain, switch the selectable digital gain between a first digital gain and a second digital gain, wherein the product of the first analog gain and the first digital gain is approximately equal to the product of the second analog gain and the second digital gain, and control an analog response of the signal path to reduce the occurrence of audio artifacts present in the output signal as a result of the switch between gain modes of the signal path.

In accordance with these and other embodiments of the present disclosure, an apparatus for providing an output signal to an audio transducer may include a signal path and a control circuit. The signal path may include an analog signal path portion and a digital signal path portion. The analog signal path portion may have an audio input for receiving an analog input signal, an audio output for providing the output signal, and a selectable analog gain, and may be configured to generate the output signal based on the analog input signal and in conformity with the selectable analog gain. The digital signal path portion may have a selectable digitally-controlled gain and may be configured to convert a digital audio input signal into the analog input signal in conformity with the selectable digitally-controlled gain, the digital signal path portion comprising a modulator. The modulator may include a forward path and a feedback path. The forward path may include a loop filter configured to generate a filtered signal responsive to the digital audio input signal and a feedback signal, a quantizer responsive to the filtered signal and configured to generate a quantized signal, and a first gain element configured to apply the selectable digitally-controlled gain to a signal within the forward path. The feedback path may be configured to generate the feedback signal responsive to the quantized signal, wherein the feedback path includes a second gain element having a gain inversely proportional to the selectable digitally-controlled gain. The control circuit may be configured to, responsive to an indication to switch between gain modes of the signal path, switch the selectable analog gain between a first analog gain and a second analog gain, and switch the selectable digitally-controlled gain between a first digital gain and a second digital gain, wherein the product of the first analog gain and the first digital gain is approximately equal to the product of the second analog gain and the second digital gain.

In accordance with these and other embodiments of the present disclosure, a method may be provided for use in a signal path comprising an analog signal path portion having an audio input for receiving an analog input signal, an audio output for providing the output signal, and a selectable analog gain, and configured to generate the output signal based on the analog input signal and in conformity with the selectable analog gain and further comprising a digital signal path portion having a selectable digitally-controlled gain and configured to convert a digital audio input signal into the analog input signal in conformity with the selectable digitally-controlled gain. The method may include generating, by a loop filter of a modulator of the digital signal path portion, a filtered signal responsive to the digital audio input signal and a feedback signal. The method may also include generating, by a quantizer of the modulator, a quantized signal responsive to the filtered signal. The method may further include applying the selectable digitally-controlled gain to a forward path of the modulator comprising the loop filter and the quantizer. The method may additionally include generating, by a feedback path, the feedback signal responsive to the quantized signal, wherein generating the feedback signal comprising applying a gain inversely proportional to the selectable digitally-controlled gain to the quantized signal. The method may also include, responsive to an indication to switch between gain modes of the signal path, switching the selectable analog gain between a first analog gain and a second analog gain, and switching the selectable digitally-controlled gain between a first digital gain and a second digital gain, wherein the product of the first analog gain and the first digital gain is approximately equal to the product of the second analog gain and the second digital gain.

In accordance with these and other embodiments of the present disclosure, a personal audio device may include an audio transducer, a signal path, and a control circuit. The audio transducer may be configured to generate sound in accordance with an output signal received by the audio transducer. The signal path may be coupled to the audio transducer, and may include an analog signal path portion and a digital signal path portion. The analog signal path portion may have an audio input for receiving an analog input signal, an audio output for providing the output signal, and a selectable analog gain, and may be configured to generate the output signal based on the analog input signal and in conformity with the selectable analog gain. The digital signal path portion may have a selectable digitally-controlled gain and may be configured to convert a digital audio input signal into the analog input signal in conformity with the selectable digitally-controlled gain, the digital signal path portion comprising a modulator. The modulator may include a forward path and a feedback path. The forward path may include a loop filter configured to generate a filtered signal responsive to the digital audio input signal and a feedback signal, a quantizer responsive to the filtered signal and configured to generate a quantized signal, and a first gain element configured to apply the selectable digitally-controlled gain to a signal within the forward path. The feedback path may be configured to generate the feedback signal responsive to the quantized signal, wherein the feedback path includes a second gain element having a gain inversely proportional to the selectable digitally-controlled gain. The control circuit may be configured to, responsive to an indication to switch between gain modes of the signal path, switch the selectable analog gain between a first analog gain and a second analog gain, and switch the selectable digitally-controlled gain between a first digital gain and a second digital gain, wherein the product of the first analog gain and the first digital gain is approximately equal to the product of the second analog gain and the second digital gain.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIGS. 4A-4C are example graphs illustrating various glitch correction approaches, in accordance with embodiments of the present disclosure;

DETAILED DESCRIPTION

In accordance with embodiments of the present disclosure, an integrated circuit for use in an audio device, such as a personal audio device (e.g., mobile telephone, portable music player, tablet computer, personal digital assistant, etc.), may include a signal path having a digital signal path portion (e.g., an audio compressor) and an analog path portion (e.g., an audio expander). The digital signal path portion may be configured to receive a digital input signal (e.g., a digital audio signal), apply a selectable digital gain x to the digital input signal, and convert the digital input signal (e.g., via a digital-to-analog converter) to an analog signal in conformity with the selectable digital gain. The analog path portion may be configured to receive the analog signal and apply (e.g., by an analog amplifier) a selectable analog gain k/x to the analog signal to generate an output signal, wherein said output signal may be communicated to a loudspeaker for playback and/or to other circuitry for processing. The numerator k of the selectable analog gain may be a constant defining an overall cumulative gain of the signal path. A control circuit coupled to the signal path may be capable of modifying the selectable digital gain and the selectable analog gain, for example to maximize a dynamic range of the signal path. For example, based on analysis of the output signal or another signal within the signal path indicative of the output signal, the control circuit may select a value for the selectable digital gain and a corresponding value for the selectable analog gain. Thus, for lower magnitudes of the output signal, the control circuit may select a higher selectable digital gain and a lower selectable analog gain, and for higher magnitudes of the output signal, the control circuit may select a lower selectable digital gain and a higher selectable analog gain. Such selectable gains may allow a signal path to increase its dynamic range to lower-magnitude signals, while preventing undesirable effects such as signal clipping for higher-magnitude signals. In operation, the control circuit may also be configured to predict, based on a magnitude of a signal indicative of the output signal, a condition for changing the selectable digital gain and the selectable analog gain, and responsive to predicting the occurrence of the condition, change, at an approximate time in which a zero crossing of the signal indicative of the output signal occurs, the selectable digital gain and the selectable analog gain.

Figure 1:
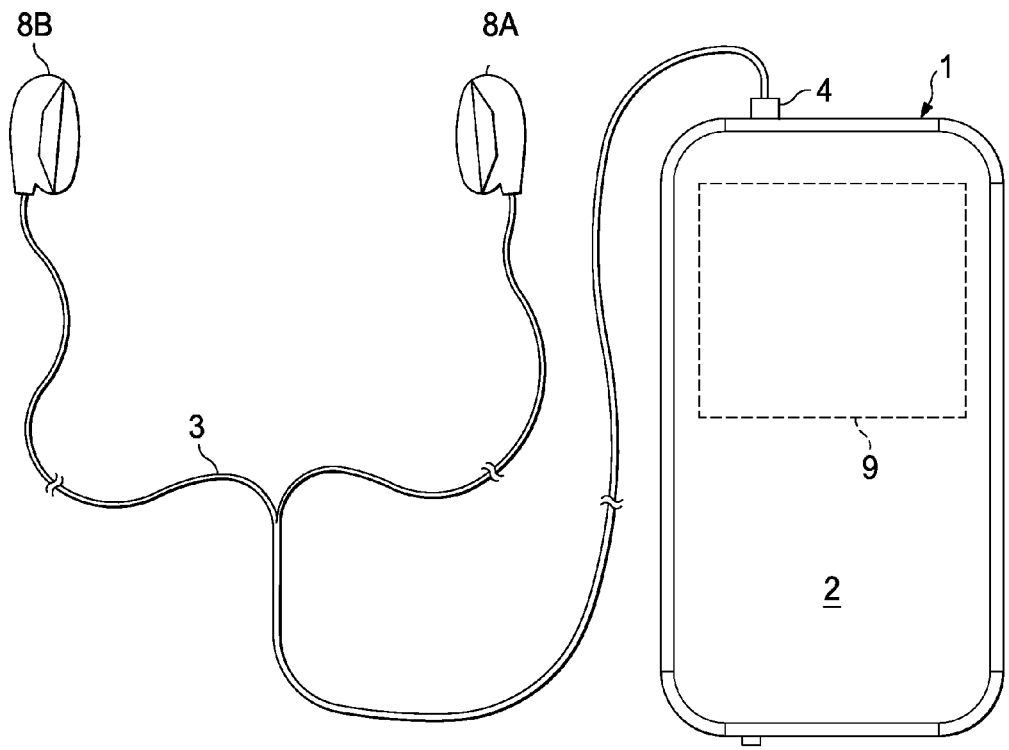
FIG. 1 is an illustration of an example personal audio device, in accordance with embodiments of the present disclosure.

The integrated circuit described above may be used in any suitable system, device, or apparatus, including without limitation, a personal audio device. FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
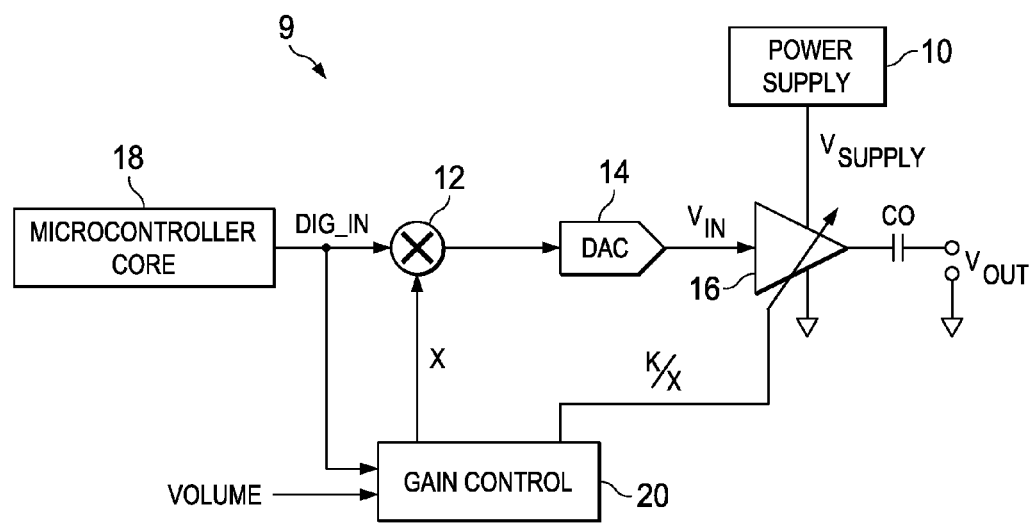
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. As shown in FIG. 2, a microcontroller core 18 may supply a digital audio input signal DIG_IN to a gain element 12 to apply a selectable digital gain x selected by gain control circuit 20 to the digital input signal DIG_IN. The amplified digital audio input signal may be communicated to a digital-to-analog converter (DAC) 14, which may convert the digital audio input signal to an analog signal $V_{IN}$. Together, gain element 12 and DAC block 14 may be referred to herein as a digital signal path portion of the signal path from the input node for digital audio input signal DIG_IN to the output node for output voltage signal $V_{OUT}$ depicted in FIG. 2. In the relevant art, gain element 12 and DAC block 14 may sometimes be referred to as an audio compressor.

DAC block 14 may supply analog signal $V_{IN}$ to an amplifier stage 16 which may amplify or attenuate audio input signal $V_{IN}$ in conformity with a selectable analog gain k/x to provide an audio output signal $V_{OUT}$, which may operate a speaker, headphone transducer, a line level signal output, and/or other suitable output. Amplifier stage 16 may be referred to herein as an analog path portion of the signal path from the input node for digital audio input signal DIG_IN to the output node for output voltage signal $V_{OUT}$ depicted in FIG. 2. In the relevant art, amplifier stage 16 may sometimes be referred to as an audio expander. A capacitor CO may be utilized to couple the output signal to the transducer or line level output, particularly if amplifier stage 16 is operated from a unipolar power supply having a quiescent voltage substantially differing from ground. A power supply 10 may provide the power supply rail inputs of amplifier stage 16.

As shown in FIG. 2, audio IC 9 may include a gain control circuit 20 configured to, based on digital audio input signal DIG_IN, control selectable digital gain x of gain element 12 and a selectable analog gain k/x of amplifier stage 16. In embodiments in which a volume control is present, a volume control signal may be provided from a microcontroller or other digital control circuit responsive to a user interface, volume knob encoder or program command, or other suitable mechanism.

As an example of the dynamic range enhancement functionality of audio IC 9, when digital audio input signal DIG_IN is at or near zero decibels (0 dB) relative to the full-scale voltage of the digital audio input signal, gain control circuit 20 may select a first digital gain (e.g., $x_1$) for the selectable digital gain and a first analog gain (e.g., $k/x_1$) for the selectable analog gain. However, if the magnitude of digital audio input signal DIG_IN is below a particular predetermined threshold magnitude relative to the full-scale voltage of digital audio input signal DIG_IN (e.g., −20 dB), gain control circuit 20 may select a second digital gain (e.g., $x_2$) greater than the first digital gain (e.g., $x_2 > x_1$) for the selectable digital gain and a second analog gain (e.g., $k/x_2$) lesser than the second analog gain (e.g., $k/x_2 < k/x_1$) for the selectable analog gain. In each case, the cumulative fixed path gain (e.g., k) of the selectable digital gain and the selectable analog gain may be substantially constant (e.g., the same within manufacturing and/or operating tolerances of audio IC 9). In some embodiments, k may be approximately equal to 1, such that the cumulative path gain is a unity gain. Such modification of digital gain and analog gain may increase the dynamic range of audio IC 9 compared to approaches in which the digital gain and analog gain are static, as it may reduce the noise injected into audio output signal $V_{OUT}$, which noise may be a generally monotonically increasing function of the analog gain of amplifier stage 16. While such noise may be negligible for higher magnitude audio signals (e.g., at or near 0 dB relative to full-scale voltage), the presence of such noise may become noticeable for lower magnitude audio signals (e.g., at or near −20 dB or lower relative to full-scale voltage). By applying a smaller analog gain at amplifier stage 16 for smaller signal magnitudes, the amount of noise injected into audio output signal $V_{OUT}$ may be reduced, while the signal level of audio output signal $V_{OUT}$ may be maintained in accordance with the digital audio input signal DIG_IN through application of a digital gain to gain element 12 inversely proportional to the analog gain.

Figure 3:
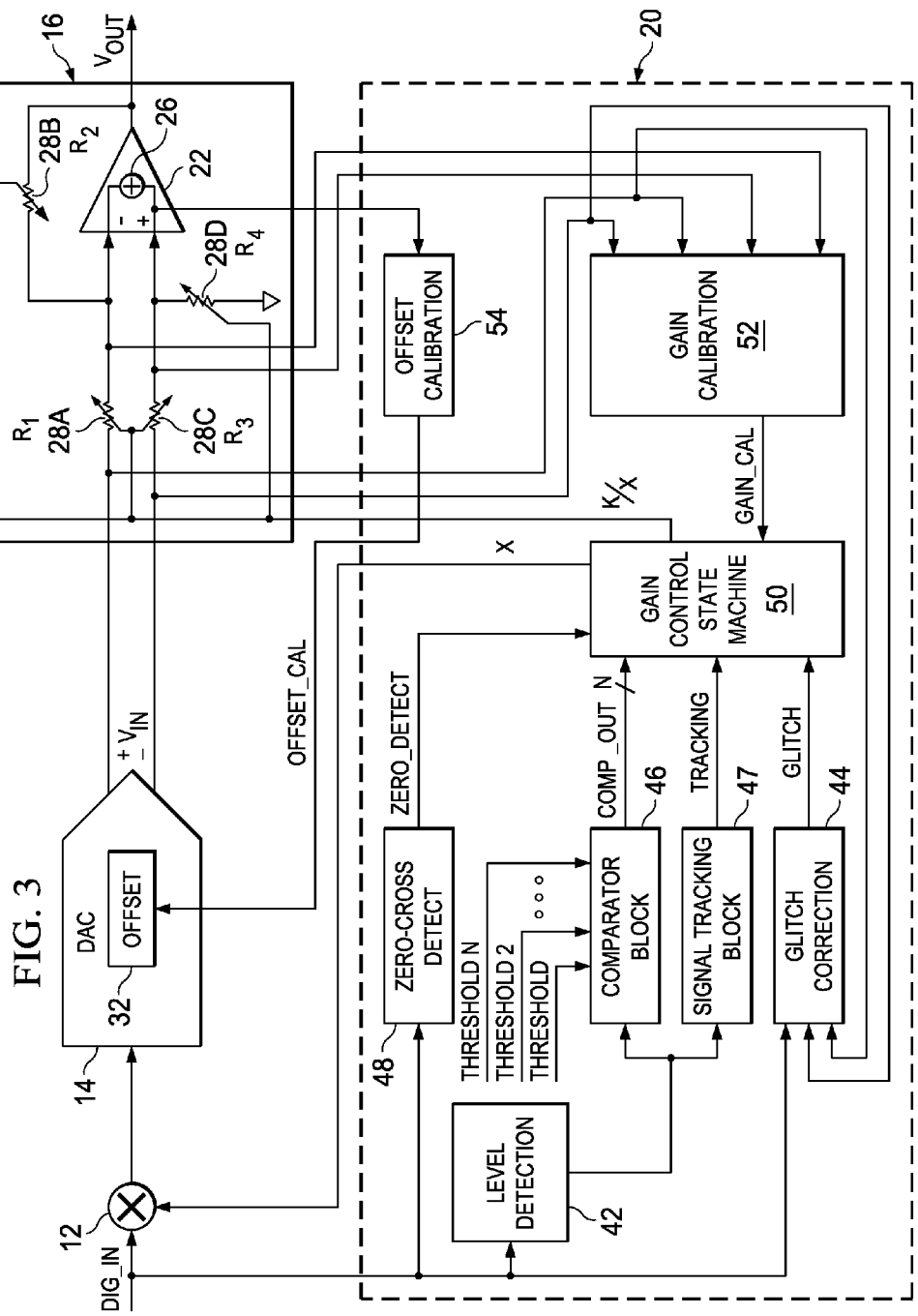
FIG. 3 is a block diagram of selected components of a gain control circuit for use within the audio integrated circuit depicted in FIG. 2, and selected components of an audio integrated circuit which may be coupled to the gain control circuit, in accordance with embodiments of the present disclosure.

FIG. 3 is a block diagram of selected components of an example gain control circuit 20 for use within audio IC 9, and selected components of audio IC 9 which may be coupled to gain control circuit 20, in accordance with embodiments of the present disclosure.

As shown in FIG. 3, amplifier stage 16 may comprise an operational amplifier 22 and a plurality of resistors 28 (e.g., 28A-28D) such that the selectable analog gain is set by the resistances $R_1$, $R_2$, $R_3$, and $R_4$ of resistors 28A, 28B, 28C, and 28D, respectively. For example, in the embodiments represented by FIG. 3, resistor 28B may have a variable resistance $R_2$. In such embodiments, resistor 28B may comprise a switched resistor network comprising a resistor string having a plurality of taps each coupled to a corresponding switch. To apply a desired selectable analog gain to amplifier stage 16, such switches may be selectively opened and closed to create an effective resistance $R_2$ between a negative input of operational amplifier 22 and the output of operational amplifier 22, wherein the selectable analog gain of operational amplifier 22 is based on such effective resistance $R_2$. Although FIG. 3 depicts a particular architecture for providing analog gain of amplifier stage 16, other suitable architectures may be applied in accordance with this disclosure.

Also as shown in FIG. 3, gain control circuit 20 may include a level detection circuit 42, a comparator block 46, a signal tracking block 47, a zero-cross detection circuit 48, a glitch correction circuit 44, a gain calibration circuit 52, an offset calibration circuit 54, and a gain control state machine 50. Level detection circuit 42 may include any suitable system, device, or apparatus for receiving digital audio input signal DIG_IN (or a derivative thereof), determining a magnitude of such signal, and outputting a signal indicative of such magnitude. Comparator block 46 may compare the output signal of level detection circuit 42 with N predetermined threshold magnitudes, wherein N is a positive integer, and based on such comparison, output a signal COMP_OUT (which may comprise N bits) indicative of whether the desired magnitude of audio output signal $V_{OUT}$ is greater or lesser than each of such predetermined threshold magnitudes. In some embodiments, such predetermined threshold magnitudes may be relative to a full-scale voltage of digital audio input signal DIG_IN and/or audio output signal $V_{OUT}$. In some embodiments, comparator block 46 may implement hysteresis, such that signal COMP_OUT or a bit thereof may only transition if the output signal of level detection block 42 remains above or below a predetermined threshold magnitude for a minimum duration of time (e.g., 0.1 seconds to place any switching artifacts outside the human-perceptible audio range).

Zero-cross detection circuit 48 may include any suitable system, device, or apparatus for detecting the occurrence of a zero crossing of digital audio input signal DIG_IN (or a derivative thereof) and outputting a signal ZERO_DETECT indicating that a zero crossing of such signal has occurred. A zero crossing of a signal may occur when the waveform of such signal crosses a magnitude of zero or crosses another level within a threshold of zero and indicative of a zero crossing (e.g., a low signal level of lower than −70 dB or within a small number of least significant bits of zero).

Signal tracking block 47 may comprise any suitable system, device, or apparatus for tracking a particular parameter of an audio signal, including without limitation a plurality of peaks of such audio signal and/or a signal envelope of such audio signal, and based thereon, generating an output signal TRACKING indicative of such tracked parameter.

Glitch correction circuit 44 may comprise any suitable system, device, or apparatus for correcting for a latency or group delay between the output of gain element 12 and the input of amplifier stage 16. Such glitch correction may account for a change of the selectable digital gain of gain element 12 which requires a latency to propagate to amplifier stage 16 where a corresponding selectable analog gain may be applied. Without such correction, the latency of group delay may cause audio artifacts to appear at the output of the signal path. Accordingly, as shown in FIG. 3, glitch correction circuit 44 may receive analog input signal $V_{IN}$ and the digital audio input signal DIG_IN to determine a latency between such signals and/or a transient response of the signal path between digital audio input signal DIG_IN and analog input signal $V_{IN}$, and based thereon, generate and communicate to gain control state machine 50 a signal GLITCH indicative of such latency and/or transient response. Based on signal GLITCH, gain control state machine 50 may control the application of selectable digital gain x of gain element 12 and a selectable analog gain k/x of amplifier stage 16 in order to reduce or eliminate glitches caused by such latency and/or transient response. In some embodiments, glitch control circuit 44 and/or gain control state machine 50 may reduce glitches by controlling an analog response of the signal path to reduce the occurrence of audio artifacts present in the output signal as a result of the switch between gain modes of the signal path, as is further described below in reference to FIGS. 4A, 4B, 4C, and 5.

Gain calibration circuit 52 may comprise any suitable system, device, or apparatus for correcting for a non-ideal gain of amplifier stage 16. Due to non-idealities of amplifier stage 16 (e.g., temperature variations, process tolerances, etc.), an actual gain of amplifier stage 16 may differ from that of a desired level of gain determined by gain control state machine 50 and/or an ideal gain calculated based on nominal values of resistances $R_1$, $R_2$, $R_3$, and $R_4$. Accordingly, gain calibration circuit 52 may determine the actual gain of amplifier stage 16 and output a signal GAIN_CAL indicative of such actual gain, and gain control state machine 50 may correct for non-idealities in selecting the selectable digital gain.

Offset calibration circuit 54 may comprise any suitable system, device, or apparatus for correcting for an offset of amplifier stage 16. To illustrate, operational amplifier 22 may include, due to non-idealities of amplifier stage 16 (e.g., temperature variations, process tolerances, etc.), a slight offset 26 from a desired ground or common mode voltage associated with amplifier stage 16, which may affect signal output $V_{OUT}$. Accordingly, offset calibration circuit 54 may determine the offset 26 of amplifier stage 16 and output a signal OFFSET_CAL, which may be communicated to an offset block 32 of DAC block 14 such that DAC block 14 may correct for such analog offset.

Gain control state machine 50 may receive signals COMP_OUT, TRACKING, ZERO_DETECT, GLITCH, and/or GAIN_CAL and based on one or more of such signals, generate the selectable digital gain and the selectable analog gain, as described in greater detail elsewhere in this disclosure. For example, when the magnitude of digital audio input signal DIG_IN transitions from above to below a predetermined threshold magnitude (e.g., −24 dB), signal COMP_OUT may indicate such transition and in response, gain control state machine 50 may wait until the occurrence of a zero crossing (as indicated by signal ZERO_DETECT), after which it may cause DAC block 14 to increase the selectable digital gain and decrease the selectable audio gain in a similar amount. By changing the selectable digital gain and the selectable audio gain at a zero crossing of digital audio input signal DIG_IN (or a derivative thereof), the change and any auditory artifacts associated with the change may be masked and therefore be unnoticeable or less noticeable to a listener of an audio device including audio IC 9.

As another example, when the sum of the magnitude of digital audio input signal DIG_IN transitions from below to above a predetermined threshold magnitude (e.g., −24 dB), signal COMP_OUT may indicate such transition, and in response gain control state machine 50 may cause DAC block 14 to decrease the selectable digital gain and increase the selectable analog gain in a similar amount. However, when transitioning to lower digital gain mode, it may not be desirable to wait for a zero crossing of the output signal, as a transition from below to above the predetermined threshold magnitude may almost immediately lead to clipping of the audio signal. Accordingly, it may be desirable to predict whether the magnitude of digital audio input signal DIG_IN is likely to cross such predetermined threshold and switch the selectable digital gain and the selectable analog gain responsive to such prediction at a zero crossing event of the digital audio input signal DIG_IN occurring before crossing of the predetermined threshold by the digital audio input signal DIG_IN. By applying such predictive techniques, gain control block 20 may facilitate switching between gain modes to increase dynamic range while reducing audio artifacts.

FIGS. 4A-4C are example graphs illustrating example glitch correction approaches that may be employed by gain control circuit 20, in accordance with embodiments of the present disclosure. FIG. 4A depicts an approach in which no glitch correction is performed by gain control circuit 20. In such approach, selectable digital gain x may change at a time $t_1$. Due to latencies in the signal path between digital audio input signal DIG_IN and analog input signal $V_{IN}$, an effective digital gain $x_{eff}$ applied to analog input signal $V_{IN}$ may be delayed from selectable digital gain x and/or may have a transient response which rises (or falls in cases when selectable digital gain x is changed from a higher to lower value) until a time $t_2$. Gain control circuit 20 may apply a corresponding change of selectable analog gain k/x at time $t_2$. As a result, the effective cumulative path gain $x_{eff} \cdot k/x$ may experience a sizable glitch 402A between times $t_1$ and $t_2$, meaning that the cumulative path gain does not have a fixed gain, as may be desired in the signal path.

As shown in FIG. 4B, in some embodiments, gain control circuit 20 may reduce glitch by controlling the change of selectable analog gain k/x so that it occurs at a time $t_2'$ during the transient response of the effective digital gain $x_{eff}$ at analog input signal $V_{IN}$. Although the time $t_2'$ is shown in FIG. 4B as occurring at the approximate middle of the transient response of the effective digital gain $x_{eff}$, gain control circuit 20 may cause selectable analog gain k/x to change during any portion of the transient response of the effective digital gain $x_{eff}$. As a result of controlling the change of selectable analog gain k/x so that it occurs at a time $t_2'$ during the transient response of the effective digital gain $x_{eff}$, the effective cumulative path gain $x_{eff} \cdot k/x$ may still experience a glitch 402B, but the integrated glitch energy in the relevant audio bandwidth (e.g., 24 Khz) may be significantly smaller as compared to that of glitch 402A, and thus may result in reduction of perceptible audio artifacts to a listener.

As shown in FIG. 4C, in some embodiments, gain control circuit 20 may reduce glitch by controlling the change of selectable analog gain k/x so that it occurs over a duration of time (e.g., over a significant portion of the transient response of the effective digital gain $x_{eff}$). In some of these embodiments, gain control circuit 20 may apply an inverse-step response filter to the selectable analog gain when switching from a first analog gain to a second analog gain over the duration of time, such that the selectable analog gain k/x transitions in steps from the first analog gain to the second analog gain. In applying the inverse-step response filter, gain control circuit 20 may apply an approximate inverse of the transient response of the effective digital gain $x_{eff}$ to the selectable analog gain when switching between the first analog gain and the second analog gain. As a result of the approach depicted in FIG. 4C, the effective cumulative path gain $x_{eff} \cdot k/x$ may still experience a glitch 402C, but such glitch 402C may be significantly smaller in magnitude as compared to that of glitch 402A, and thus may result in reduction of perceptible audio artifacts.

Figure 5:
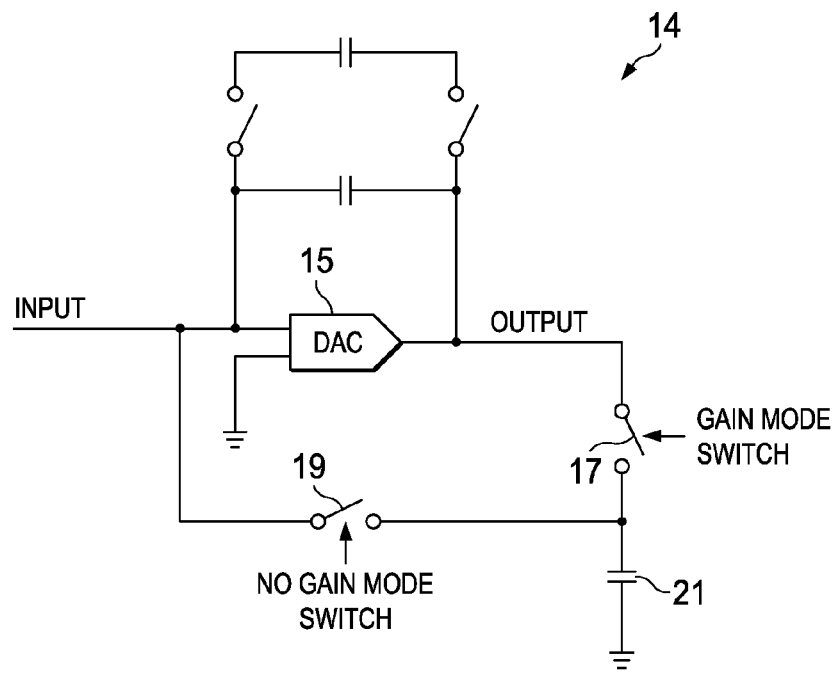
FIG. 5 illustrates a block diagram of an example implementation of a digital-to-analog converter, in accordance with embodiments of the present disclosure.

FIG. 5 illustrates a block diagram of an example implementation of DAC block 14, in accordance with embodiments of the present disclosure. As shown in FIG. 5, DAC block 14 may include a DAC 15, a capacitor 21 coupled between ground and a switch node, a switch 17 coupled between an output of DAC 15 and the switch node, and a switch 19 coupled between an input of DAC 15 and the switch node. When no change between gain modes is occurring, gain control circuit 20 may activate switch 19, coupling the input to the switch node. On the other hand, when a change between gain modes is occurring, gain control circuit 20 may activate switch 17, coupling the output to the switch node. The effect of activating switch 17 during changes between gain modes is to modify an analog response of at least one of a modulator internal to DAC 15 and/or DAC 15 itself for the duration of time in which switch 17 is activated. For example, activation of switch 17 may bypass a low-pass filter of DAC 15 for the duration of time. Such reshaping of the analog response of the modulator internal to DAC 15 and/or DAC 15 itself may be to reduce latency between digital audio input signal DIG_IN and analog input signal $V_{IN}$ and/or decrease the transient duration of effective digital gain $x_{\mathit{eff}}$ at analog input signal $V_{IN}$, thus reducing glitch.

Figure 6:
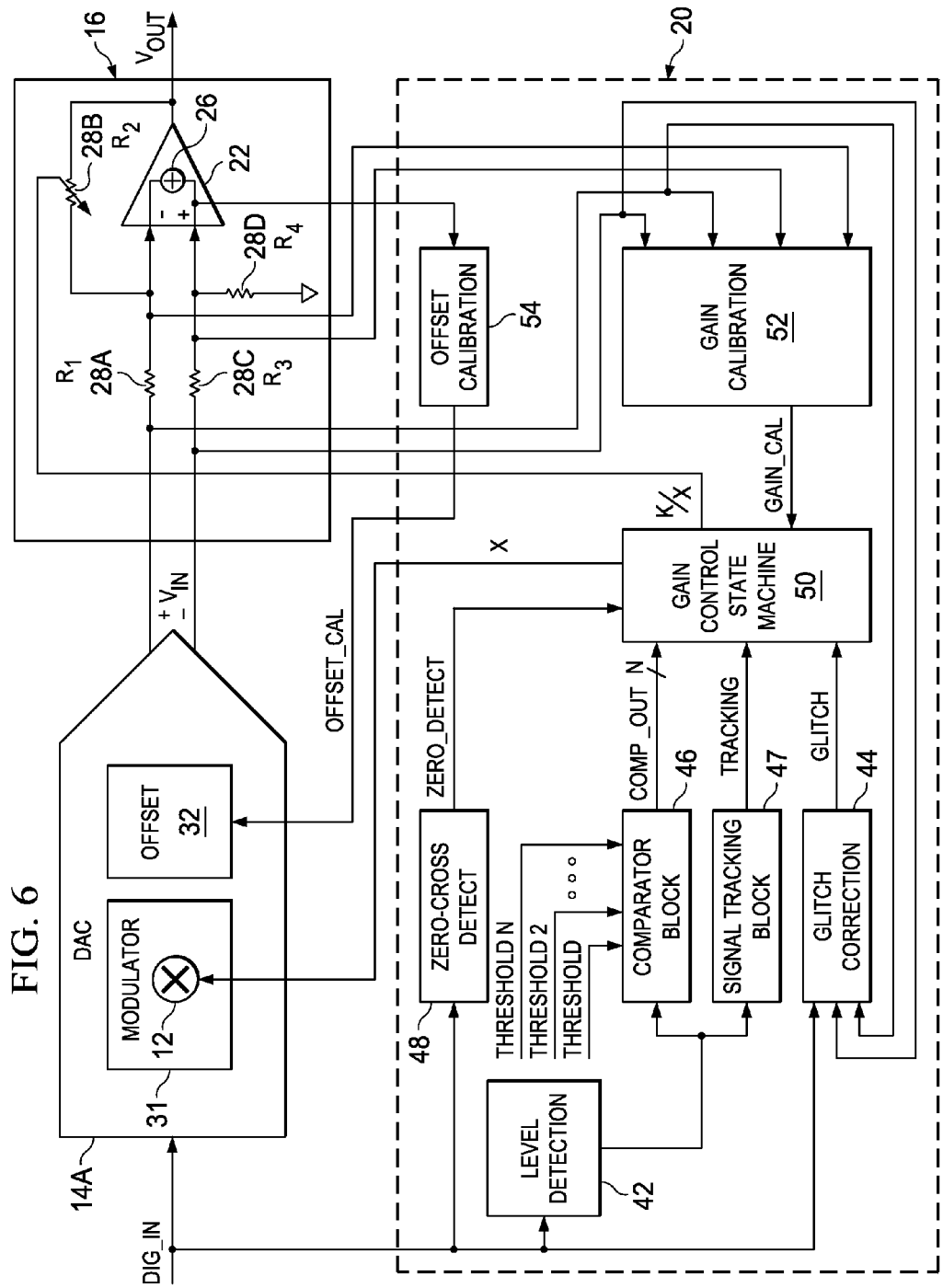
FIG. 6 is a block diagram of selected components of a gain control circuit for use within the audio integrated circuit depicted in FIG. 2, and selected components of an audio integrated circuit which may be coupled to the gain control circuit, in accordance with embodiments of the present disclosure.

FIG. 6 is a block diagram of selected components of a gain control circuit for use within the audio integrated circuit depicted in FIG. 2, and selected components of an audio integrated circuit which may be coupled to the gain control circuit, in accordance with embodiments of the present disclosure. The topology of FIG. 6 is similar to that of FIG. 3, except that DAC block 14 is replaced with a DAC block 14A, and gain element 12 has been placed within a modulator 31 of DAC block 14A.

Figure 7:
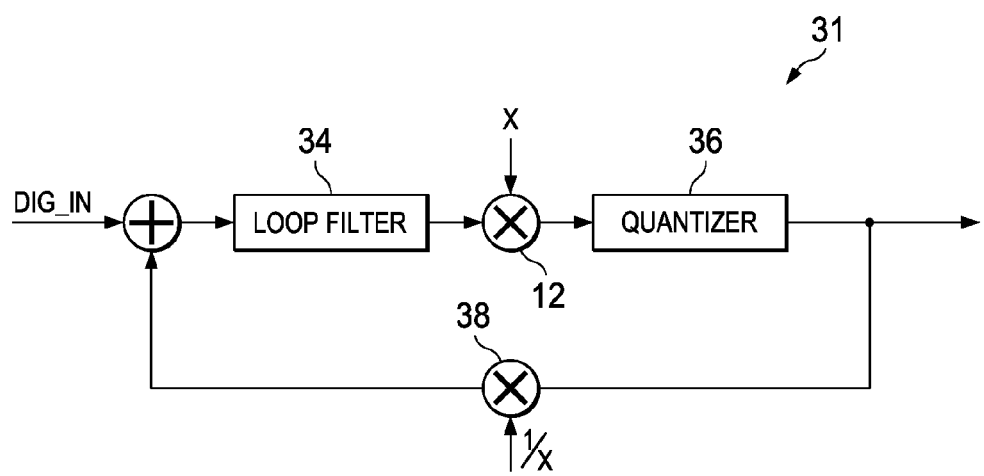
FIG. 7 is a block diagram of a modulator for use within a digital-to-analog converter depicted in FIG. 6, in accordance with embodiments of the present disclosure.

FIG. 7 is a block diagram of a modulator 31 for use within DAC block 14A, in accordance with embodiments of the present disclosure. As shown in FIG. 7, DAC block 14A may include a forward path comprising a loop filter 34 configured to generate a filtered signal responsive to digital audio input signal DIG_IN and a feedback signal (e.g., based on an error signal equal to the difference of the digital audio input signal and the feedback signal), a quantizer 36 responsive to the filtered signal and configured to generate a quantized signal, and gain element 12 (e.g., interfaced between loop filter 34 and quantizer 36) configured to apply a selectable digitally-controlled gain x to a signal within the forward path. DAC block 14A may also include a feedback path configured to generate the feedback signal responsive to the quantized signal, wherein the feedback path includes a gain element 38 having a gain 1/x inversely proportional to the selectable digitally-controlled gain of gain element 12. By moving gain element 12 inside modulator 31 of DAC block 14A (as opposed to before DAC block 14 as shown in FIG. 3), the transient duration of the response of the selectable digitally-controlled gain x may be shorter, which may reduce a glitch on output signal $V_{OUT}$ as compared to the topology shown in FIG. 3.

Although the various systems and methods described herein contemplate reduction of audio artifacts in audio paths personal audio devices, the systems and methods herein may also apply to any other audio systems, including, without limitation, home audio systems, theaters, automotive audio systems, live performances, etc.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. An apparatus for providing an output signal to an audio transducer, comprising:
   a signal path comprising:
     an analog signal path portion having an audio input for receiving an analog input signal, an audio output for providing the output signal, and a selectable analog gain, and configured to generate the output signal based on the analog input signal and in conformity with the selectable analog gain; and
     a digital signal path portion having a selectable digital gain and configured to convert a digital audio input signal into the analog input signal in conformity with the selectable digital gain;
     wherein a transfer function of the signal path causes an effective digital gain applied at the analog input signal to have a transient response; and
   a control circuit configured to, responsive to an indication to switch between gain modes of the signal path:
     switch the selectable analog gain between a first analog gain and a second analog gain;
     switch the selectable digital gain between a first digital gain and a second digital gain, wherein the product of the first analog gain and the first digital gain is approximately equal to the product of the second analog gain and the second digital gain; and
     control an analog response of the signal path to reduce the occurrence of audio artifacts present in the output signal as a result of the switch between gain modes of the signal path by switching from the first analog gain to the second analog gain at a duration of time after switching from the first digital gain to the second digital gain and at a point in time during a duration of the transient response.

2. The apparatus of claim 1, wherein the indication to switch between gain modes of the signal path comprises a threshold crossing of a magnitude of a signal indicative of the output signal.

3. The apparatus of claim 1, wherein the control circuit is configured to control the analog response of the signal path to reduce the occurrence of audio artifacts by switching from the first analog gain to the second analog gain over a duration of time.

4. The apparatus of claim 1, wherein the control circuit is configured to control the analog response of the signal path to reduce the occurrence of audio artifacts by applying an inverse-step response filter to the selectable analog gain when switching from the first analog gain to the second analog gain over a duration of time.

5. The apparatus of claim 1, wherein a transfer function of the signal path causes an effective digital gain applied at the analog input signal to have a transient response, wherein the control circuit is configured to control the analog response of the signal path to reduce the occurrence of audio artifacts by applying an approximate inverse of the transient response to the selectable analog gain when switching between the first analog gain and the second analog gain.

6. The apparatus of claim 1, wherein the digital signal path portion comprises a modulator and a digital-to-analog converter, and wherein the control circuit is configured to control the analog response of the signal path to reduce the occurrence of audio artifacts by modifying an analog response of at least one of the modulator and the digital-to-analog converter for a duration of time.

7. The apparatus of claim 6, wherein modifying the analog response of at least one of the modulator and the digital-to-analog converter comprises bypassing the filter response of the digital-to-analog converter for the duration of time.

8. A method comprising,
in a signal path comprising an analog signal path portion having an audio input for receiving an analog input signal, an audio output for providing an output signal, and a selectable analog gain, and configured to generate the output signal based on the analog input signal and in conformity with the selectable analog gain and further comprising a digital signal path portion having a selectable digital gain and configured to convert a digital audio input signal into the analog input signal in conformity with the selectable digital gain:
responsive to an indication to switch between gain modes of the signal path:
switching the selectable analog gain between a first analog gain and a second analog gain;
switching the selectable digital gain between a first digital gain and a second digital gain, wherein the product of the first analog gain and the first digital gain is approximately equal to the product of the second analog gain and the second digital gain, wherein a transfer function of the signal path causes an effective digital gain applied at the analog input signal to have a transient response; and
controlling an analog response of the signal path to reduce the occurrence of audio artifacts present in the output signal as a result of the switch between gain modes of the signal path by switching from the first analog gain to the second analog gain at a duration of time after switching from the first digital gain to the second digital gain and at a point in time during a duration of the transient response.

9. The method of claim 8, wherein the indication to switch between gain modes of the signal path comprises a threshold crossing of a magnitude of a signal indicative of the output signal.

10. The method of claim 8, further comprising controlling the analog response of the signal path to reduce the occurrence of audio artifacts by switching from the first analog gain to the second analog gain over a duration of time.

11. The method of claim 8, further comprising controlling the analog response of the signal path to reduce the occurrence of audio artifacts by applying an inverse-step response filter to the selectable analog gain when switching from the first analog gain to the second analog gain over a duration of time.

12. The method of claim 8, wherein a transfer function of the signal path causes an effective digital gain applied at the analog input signal to have a transient response, wherein the method further comprises controlling the analog response of the signal path to reduce the occurrence of audio artifacts by applying an approximate inverse of the transient response to the selectable analog gain when switching between the first analog gain and the second analog gain.

13. The method of claim 8, wherein the digital signal path portion comprises a modulator and a digital-to-analog converter, and wherein further comprising controlling the analog response of the signal path to reduce the occurrence of audio artifacts by modifying an analog response of at least one of the modulator and the digital-to-analog converter for a duration of time.

14. The method of claim 13, wherein modifying the analog response of at least one of the modulator and the digital-to-analog converter comprises bypassing the filtering response of the digital-to-analog converter for the duration of time.

15. A personal audio device comprising:
an audio transducer configured to generate sound in accordance with an output signal received by the audio transducer;
a signal path coupled to the audio transducer, wherein the signal path comprises:
an analog signal path portion having an audio input for receiving an analog input signal, an audio output for providing the output signal, and a selectable analog gain, and configured to generate the output signal based on the analog input signal and in conformity with the selectable analog gain; and
a digital signal path portion having a selectable digital gain and configured to convert a digital audio input signal into the analog input signal in conformity with the selectable digital gain;
wherein a transfer function of the signal path causes an effective digital gain applied at the analog input signal to have a transient response; and
a control circuit configured to, responsive to an indication to switch between gain modes of the signal path:
switch the selectable analog gain between a first analog gain and a second analog gain;
switch the selectable digital gain between a first digital gain and a second digital gain, wherein the product of the first analog gain and the first digital gain is approximately equal to the product of the second analog gain and the second digital gain; and
control an analog response of the signal path to reduce the occurrence of audio artifacts present in the output signal as a result of the switch between gain modes of the signal path by switching from the first analog gain to the second analog gain at a duration of time after switching from the first digital gain to the second digital gain and by switching from the first analog gain to the second analog gain at a point in time during a duration of the transient response.

16. The personal audio device of claim 15, wherein the indication to switch between gain modes of the signal path comprises a threshold crossing of a magnitude of a signal indicative of the output signal.

17. The personal audio device of claim 16, wherein the control circuit is configured to control the analog response of the signal path to reduce the occurrence of audio artifacts by switching from the first analog gain to the second analog gain over a duration of time.

18. The personal audio device of claim 16, wherein the control circuit is configured to control the analog response of the signal path to reduce the occurrence of audio artifacts by applying an inverse-step response filter to the selectable analog gain when switching from the first analog gain to the second analog gain over a duration of time.

19. The personal audio device of claim 16, wherein a transfer function of the signal path causes an effective digital gain applied at the analog input signal to have a transient response, wherein the control circuit is configured to control the analog response of the signal path to reduce the occurrence of audio artifacts by applying an approximate inverse of the transient response to the selectable analog gain when switching between the first analog gain and the second analog gain.

20. The personal audio device of claim 16, wherein the digital signal path portion comprises a modulator and a digital-to-analog converter, and wherein the control circuit is configured to control the analog response of the signal path to reduce the occurrence of audio artifacts by modifying an analog response of at least one of the modulator and the digital-to-analog converter for a duration of time.

21. The personal audio device of claim 20, wherein modifying the analog response of at least one of the modulator and the digital-to-analog converter comprises bypassing the filter response of the digital-to-analog converter for the duration of time.

22. An apparatus for providing an output signal to an audio transducer, comprising:
a signal path comprising:
an analog signal path portion having an audio input for receiving an analog input signal, an audio output for providing the output signal, and a selectable analog gain, and configured to generate the output signal based on the analog input signal and in conformity with the selectable analog gain; and
a digital signal path portion having a selectable digital gain and configured to convert a digital audio input signal into the analog input signal in conformity with the selectable digital gain, wherein the digital signal path portion comprises a modulator and a digital-to-analog converter; and
a control circuit configured to, responsive to an indication to switch between gain modes of the signal path:
switch the selectable analog gain between a first analog gain and a second analog gain;
switch the selectable digital gain between a first digital gain and a second digital gain, wherein the product of the first analog gain and the first digital gain is approximately equal to the product of the second analog gain and the second digital gain; and
control an analog response of the signal path to reduce the occurrence of audio artifacts present in the output signal as a result of the switch between gain modes of the signal path by modifying an analog response of at least one of the modulator and the digital-to-analog converter for a duration of time by bypassing the filter response of the digital-to-analog converter for the duration of time.

23. The apparatus of claim 22, wherein the indication to switch between gain modes of the signal path comprises a threshold crossing of a magnitude of a signal indicative of the output signal.

24. The apparatus of claim 22, wherein the control circuit is configured to control the analog response of the signal path to reduce the occurrence of audio artifacts by switching from the first analog gain to the second analog gain over a duration of time.

25. The apparatus of claim 22, wherein the control circuit is configured to control the analog response of the signal path to reduce the occurrence of audio artifacts by applying an inverse-step response filter to the selectable analog gain when switching from the first analog gain to the second analog gain over a duration of time.

26. The apparatus of claim 22, wherein a transfer function of the signal path causes an effective digital gain applied at the analog input signal to have a transient response, wherein the control circuit is configured to control the analog response of the signal path to reduce the occurrence of audio artifacts by applying an approximate inverse of the transient response to the selectable analog gain when switching between the first analog gain and the second analog gain.

27. A method comprising, in a signal path comprising an analog signal path portion having an audio input for receiving an analog input signal, an audio output for providing an output signal, and a selectable analog gain, and configured to generate the output signal based on the analog input signal and in conformity with the selectable analog gain and further comprising a digital signal path portion having a selectable digital gain and configured to convert a digital audio input signal into the analog input signal in conformity with the selectable digital gain, wherein the digital signal path portion comprises a modulator and a digital-to-analog converter:
responsive to an indication to switch between gain modes of the signal path:
switching the selectable analog gain between a first analog gain and a second analog gain;
switching the selectable digital gain between a first digital gain and a second digital gain, wherein the product of the first analog gain and the first digital gain is approximately equal to the product of the second analog gain and the second digital gain; and
controlling an analog response of the signal path to reduce the occurrence of audio artifacts present in the output signal as a result of the switch between gain modes of the signal path by modifying an analog response of at least one of the modulator and the digital-to-analog converter for a duration of time by bypassing the filtering response of the digital-to-analog converter for the duration of time.

28. The method of claim 27, wherein the indication to switch between gain modes of the signal path comprises a threshold crossing of a magnitude of a signal indicative of the output signal.

29. The method of claim 27, further comprising controlling the analog response of the signal path to reduce the occurrence of audio artifacts by switching from the first analog gain to the second analog gain over a duration of time.

30. The method of claim 27, further comprising controlling the analog response of the signal path to reduce the occurrence of audio artifacts by applying an inverse-step response filter to the selectable analog gain when switching from the first analog gain to the second analog gain over a duration of time.

31. The method of claim 27, wherein a transfer function of the signal path causes an effective digital gain applied at the analog input signal to have a transient response, wherein the method further comprises controlling the analog response of the signal path to reduce the occurrence of audio artifacts by applying an approximate inverse of the transient response to the selectable analog gain when switching between the first analog gain and the second analog gain.

32. A personal audio device comprising:
an audio transducer configured to generate sound in accordance with an output signal received by the audio transducer;
a signal path coupled to the audio transducer, wherein the signal path comprises:
an analog signal path portion having an audio input for receiving an analog input signal, an audio output for providing the output signal, and a selectable analog gain, and configured to generate the output signal based on the analog input signal and in conformity with the selectable analog gain; and
a digital signal path portion having a selectable digital gain and configured to convert a digital audio input signal into the analog input signal in conformity with the selectable digital gain;
wherein the digital signal path portion comprises a modulator and a digital-to-analog converter; and
a control circuit configured to, responsive to an indication to switch between gain modes of the signal path:
switch the selectable analog gain between a first analog gain and a second analog gain;
switch the selectable digital gain between a first digital gain and a second digital gain, wherein the product of the first analog gain and the first digital gain is approximately equal to the product of the second analog gain and the second digital gain; and
control an analog response of the signal path to reduce the occurrence of audio artifacts present in the output signal as a result of the switch between gain modes of the signal path by modifying an analog response of at least one of the modulator and the digital-to-analog converter for a duration of time by bypassing the filter response of the digital-to-analog converter for the duration of time.

33. The personal audio device of claim 32, wherein the indication to switch between gain modes of the signal path comprises a threshold crossing of a magnitude of a signal indicative of the output signal.

34. The personal audio device of claim 32, wherein the control circuit is configured to control the analog response of the signal path to reduce the occurrence of audio artifacts by switching from the first analog gain to the second analog gain over a duration of time.

35. The personal audio device of claim 32, wherein the control circuit is configured to control the analog response of the signal path to reduce the occurrence of audio artifacts by applying an inverse-step response filter to the selectable analog gain when switching from the first analog gain to the second analog gain over a duration of time.

36. The personal audio device of claim 32, wherein a transfer function of the signal path causes an effective digital gain applied at the analog input signal to have a transient response, wherein the control circuit is configured to control the analog response of the signal path to reduce the occurrence of audio artifacts by applying an approximate inverse of the transient response to the selectable analog gain when switching between the first analog gain and the second analog gain.

* * * * *